United States Patent [19]

Maeda et al.

[11] Patent Number: 4,560,637
[45] Date of Patent: Dec. 24, 1985

[54] SILVER HALIDE SENSOR TYPE POLYMERIZABLE LIGHT-SENSITIVE MATERIAL

[75] Inventors: Minoru Maeda; Noriyuki Inoue; Mikio Totsuka, all of Shizuoka, Japan

[73] Assignee: Fuji Photo Film Co., Ltd., Kanagawa, Japan

[21] Appl. No.: 451,911

[22] Filed: Dec. 21, 1982

[30] Foreign Application Priority Data

Dec. 22, 1981 [JP] Japan ................................ 56-207731

[51] Int. Cl.$^4$ ......................... G03C 1/06; G03C 5/54; G03C 5/30
[52] U.S. Cl. .................................... 430/202; 430/264; 430/281; 430/436; 430/478
[58] Field of Search ............... 430/436, 202, 264, 281, 430/919, 269, 416, 478, 949, 464

[56] References Cited

U.S. PATENT DOCUMENTS 3,730,727  3/1971  Olivares et al. .................... 430/464
3,746,542  7/1973  Hayakawa et al. ................. 430/324

FOREIGN PATENT DOCUMENTS 1269711  4/1972  United Kingdom .

Primary Examiner—John E. Kittle
Assistant Examiner—Cynthia Hamilton
Attorney, Agent, or Firm—Sughrue, Mion, Zinn Macpeak & Seas

[57] ABSTRACT

A process for forming a polymeric image in a silver halide sensor type polymerizable light-sensitive material having a silver halide photographic emulsion layer is disclosed. The process is comprised of reducing a development nucleus-containing silver halide using at least one phenol compound and at least one hydrazine compound in the presence of at least one non-gaseous ethylenically unsaturated compound capable of undergoing addition polymerization to selectively polymerize the non-gaseous ethylenically unsaturated compound in an area where the development nucleus-containing silver halide is present. The phenol compound is represented by the following general formula (I):

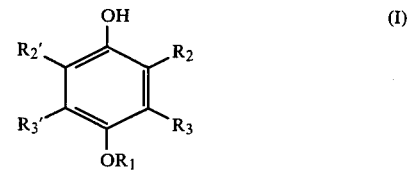

wherein $R_1$, $R_2$, $R_2'$, $R_3$ and $R_3'$ are defined within the disclosure. The hydrazine compound is represented by the following general formula (II):

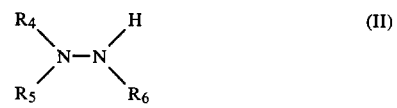

wherein $R_4$, $R_5$ and $R_6$ are defined within the disclosure. The process for forming a polymeric image exhibits a high sensitivity and provides a negative polymeric image with respect to the silver image. A silver halide sensor type polymerizable light-sensitive material suitable for use in the process is also disclosed.

27 Claims, No Drawings

4,560,637

SILVER HALIDE SENSOR TYPE POLYMERIZABLE LIGHT-SENSITIVE MATERIAL

FIELD OF THE INVENTION

The present invention relates to a process for forming polymeric images. More particularly, it relates to a process comprising selectively forming a polymeric compound on parts of a photographic material corresponding to photographic latent images using a silver halide photographic emulsion and a reducing agent. Furthermore, the present invention relates to a silver halide sensor type polymerizable light-sensitive material in which a non-gaseous ethylenically unsaturated compound capable of undergoing addition polymerization is polymerized simultaneously with a reduction reaction of silver halide in the presence of exposed silver halide.

BACKGROUND OF THE INVENTION

Various processes for forming images which comprise polymerizing ethylenically unsaturated compounds by the action of light to form a polymeric compound (polymer) have been proposed. Further, it has been proposed to use silver halide as a catalyst to directly cause photopolymerization as described in British Pat. No. 866,631 and S. Levinos et al., *Photographic Science & Engineering*, Vol. 6, pages 222–226 (1962). In such cases, it has been believed that the product formed by photolysis of silver halide functions directly as a catalyst for polymerization, and a sensitivity as high as that of the case wherein silver halide particles are reduced by conventional development cannot be obtained.

It has also been proposed to use a process which comprises developing exposed silver halide emulsion particles with a conventional developing solution and polymerizing ethylenically unsaturated compounds by utilizing the formed silver images or unreacted silver halide as a catalyst to imagewise form polymers, as described in Belgian Pat. No. 642,477. This process has a problem in that the development operation and the polymerization operation should be carried out separately.

In a process which comprises developing exposed silver halide in the presence of an ethylenically unsaturated compound using a reducing compound to cause polymerization of the ethylenically unsaturated compounds by the action of an oxidation product or an intermediate product formed in the developing process, it has been proposed to carry out the reaction using a so-called benzenoid compound having two or more hydroxyl groups, amino groups, or amino groups substituted by alkyl or aryl groups, on the ortho- or para-positions of the benzene ring as the reducing agent, as described in U.S. Pat. No. 3,019,104 and G. Oster, *Nature*, Vol. 180, page 1275 (1957). However, in an example of the reaction by such a benzenoid compound, an increase of the optical density of the silver image is observed, but an increase of the viscosity is not observed. Also, the generation of heat of reaction and the separation of formed polymeric molecules are not observed. So, in this study, the evidence of forming polymeric molecules is not confirmed.

Furthermore, it has been reported by other researchers that they did not succeed in supplementary examinations; e.g., see S. Levinos and F. W. H. Mueller, *Photographic Science & Engineering*, Vol. 6, page 222 (1962).

It has also been proposed to polymerize ethylenically unsaturated compounds in the presence of exposed silver halide using resorcinol, naphthol, pyrazolone or hydrazine compounds as the polymerization initiator, as described in Japanese Patent Publication No. 6581/71, and U.S. Pat. Nos. 3,697,275, 3,782,944, 3,756,818, 3,767,400, 3,782,943, 3,697,273, 3,707,379, 3,687,667, 3,874,947, 3,756,820, 3,790,378 and 3,746,542. Although a polymer of the ethylenically unsaturated compounds is formed in such cases, the sensitivity thereof is not generally satisfactory.

Further, a process using hydroquinone, etc., as the polymerization initiator, wherein the polymerization reaction is caused on the part where silver halide is not reduced, namely, the unexposed area, to form polymeric images that are negative with respect to the exposed silver halide image has been disclosed in U.S. Pat. No. 4,287,290. However, such a process is not satisfactory from the viewpoint of sensitivity.

SUMMARY OF THE INVENTION

An object of the present invention is to provide a process showing a high sensitivity wherein non-gaseous ethylenically unsaturated compounds are polymerized in the presence of exposed silver halide.

Another object of the present invention is to provide a silver halide light-sensitive material having a high sensitivity which is capable of forming a negative polymeric image with respect to the exposed silver halide image.

Other objects of the present invention will become apparent from the following detailed description and examples.

It has now been found that polymerization of non-gaseous ethylenically unsaturated compounds occurs when silver halide is reduced in the presence of the non-gaseous ethylenically unsaturated compounds using a certain phenol compound as described below, and that the polymerization rate increases super-additively by using a certain hydrazine compound as described below together with the phenol compound. Furthermore, when a silver halide photographic emulsion is used as the silver halide, the reaction is further rapidly caused in cases wherein the fine silver halide crystals have development nuclei. Accordingly, if the reacting condition and the reacting time are suitably controlled, polymerization can be selectively caused only where silver halide particles having development nuclei are present.

The present invention has been attained by utilizing the above described phenomenon. Particularly, the present invention is attained by processing a photographic material comprising a support having thereon a silver halide photographic emulsion layer containing a photographic latent image with at least one phenol compound and at least one hydrazine compound in the presence of polymerizable non-gaseous ethylenically unsaturated compounds to selectively polymerize the non-gaseous ethylenically unsaturated compounds on the latent image portions. The phenol compound is represented by the following general formula (I):

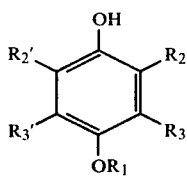

(I)

wherein $R_1$ represents an alkyl group or a substituted alkyl group; $R_2$ and $R_2'$, which may be the same or different, each represents hydrogen, an alkyl group, a substituted alkyl group, an aryl group, a substituted aryl group, an aralkyl group or a halogen atom; and $R_3$ and $R_3'$, which may be the same or different, each represents hydrogen, an alkyl group, a substituted alkyl group, an aryl group, a substituted aryl group, an aralkyl group, an alkoxy group, a thioalkyl group or a halogen atom. The hydrazine compound is represented by the following general formula (II):

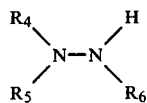

(II)

wherein $R_4$ represents hydrogen, a sulfo group (which may be a water-soluble metal salt or ammonium salt), an alkyl group, a substituted alkyl group, an aryl group, a substituted aryl group, an aralkyl group, a substituted aralkyl group, an acyl group, a substituted acyl group, an arylhydrazinocarbonyl group, a thiocarbamoyl group, an arylazothiocarbonyl group, an arylsulfonyl group or a substituted arylsulfonyl group; $R_5$ represents hydrogen, an alkyl group, a substituted alkyl group or an aryl group; $R_4$ and $R_5$ may be bonded to each other to form a ring comprising a member selected from a carbon atom, an oxygen atom and a nitrogen atom; $R_6$ represents hydrogen, a sulfo group (which may be a water-soluble metal salt or ammonium salt), an aryl group, an acyl group or a substituted acyl group; and $R_4$ and $R_6$ may be bonded to each other to form a ring, or a salt thereof.

DETAILED DESCRIPTION OF THE INVENTION

The expression "photographic latent image" refers to an invisible imagewise change formed in a silver halide photographic emulsion by the action of electromagnetic wave or corpuscular radiation, which can be formed into a visible image by development processing. In conventional negative emulsions, the latent image is formed when development nuclei are formed on silver halide particles irradiated with electromagnetic wave or corpuscular radiation. In direct positive emulsions, the latent image is formed by disappearance of development nuclei which are initially formed on all particles, by imagewise irradiation, as described by James and Huggins in *Fundamentals of Photographic Theory*, 2nd Edition, Chapters 3 and 4, published by Morgan & Morgan Co. (1960).

Examples of silver halide photographic emulsions used in the present invention include not only those wherein development nuclei are formed on a part which is imagewise irradiated with electromagnetic wave or corpuscular radiation, namely, conventional silver halide photographic emulsions capable of forming negative images by development, but also so-called direct positive emulsions wherein silver halide particles in parts which are not subjected to imagewise exposure to light have a larger number of development nuclei than those parts which have been subjected to iamgewise exposure.

In the present invention, silver halide photographic emulsions which are subjected to conventional development processing can be advantageously used as the silver halide photographic emulsions for forming negative images. More particularly, it is possible to use photographic emulsions composed of silver chloride, silver bromide, silver chlorobromide, silver iodobromide, or silver chloroiodobromide. The photographic emulsions used in the present invention may be subjected to chemical sensitization and spectral sensitization such as is applied to conventional photographic emulsions. With respect to chemical sensitization, it can be carried out using sulfur sensitization, noble metal sensitization, or reduction sensitization as described, for example, by P. Glafkides, *Chimie Photographique*, 2nd Edition, pages 247–301, *Photocinema*, Paul Montel, Paris (1957), and by James, *The Theory of the Photographic Process*, 4th Edition, Chapter 5, published by Macmillan Co. (1977). With respect to spectral sensitization, spectral sensitizing dyes used in conventional photographic processes such as cyanine dyes, merocyanine dyes, etc., as described by Shinichi Kikuchi et al., *Shashin Binran*, Vol. 2, pages 15–24, published by Maruzen Co. (1959), can effectively be used. Further, the emulsions used in the present invention may contain stabilizers as utilized in conventional photographic processes.

The direct positive silver halide photographic emulsions capable of being used in the present invention can be produced by utilizing techniques such as solarization, the Herschel effect, the Clayden effect, and the Sabattier effect as described, for example, in C. E. K. Mees, *The Theory of the Photographic Process*, 2nd Edition, Chapters 6 and 7, Macmillan Co. (1954).

In order to produce a direct positive image in a silver halide emulsion layer by utilizing solarization, a silver halide photographic emulsion layer of a type of easily undergoing solarization is produced, an the whole surface thereof is preliminarily uniformly exposed to light or processed with a chemical agent so as to be capable of development without imagewise exposure. Examples of processes for preparation of such emulsions are described, for example, in British Pat. Nos. 443,245 and 462,730.

The Herschel effect is caused by imagewise application of light of long wavelength to silver halide which has been uniformly exposed to light or processed with a chemical agent so as to be capable of development uniformly. In this case, silver chloride rich silver halide emulsions are advantageously used. Furthermore, in order to accelerate the Herschel effect, desensitizing dyes such as Pinakryptol Yellow, Phenosafranine, etc., may be added. Processes for producing direct positive emulsions utilizing the Herschel effect have been described, for example, in British Pat. No. 667,206 and U.S. Pat. No. 2,857,273.

In order to obtain a direct positive image by utilizing the Clayden effect, it is necessary to uniformly expose the surface of a silver halide emulsion layer at a comparatively low illuminance after applying imagewise exposure at a high illuminance for a short time. Thus, after the uniform exposure, the parts which have not been subjected to imagewise exposure at a high illuminance become developable.

According to the Sabattier effect, the silver halide emulsion layer is uniformly exposed to light while being immersed in a developing solution, or is processed with a chemical agent after being subjected to imagewise exposure, by which parts of the layer which have not been subjected to imagewise exposure become developable. In practice, the Clayden effect and the Sabattier effect can be easily created by using silver halide emulsions which have a tendency to form development nuclei in the interior of silver halide particles (as compared with the surface thereof) by an initial imagewise exposure.

Processes for producing such emulsions which easily form internal development nuclei have been described, for example, in U.S. Pat. Nos. 2,592,250 and 2,497,876, British Pat. No. 1,011,062, and German Pat. No. 1,207,791.

It is also possible to form positive images by using core-shell emulsions. Processes for producing core-shell emulsions are described, for example, in U.S. Pat. Nos. 3,761,276 and 3,206,313.

The above described photographic emulsions comprise systems in which silver halide particles are dispersed in a solution of hydrophilic polymeric binder, and gelatin is generally used as the hydrophilic polymeric binder. However, other hydrophilic colloids can be used, too. For example, it is possible to use proteins such as gelatin derivatives, graft polymers of gelatin with other polymers, albumin, casein, etc.; sugar derivatives, including cellulose derivatives such as hydroxyethyl cellulose, carboxymethyl cellulose, cellulose sulfate, etc., sodium alginate or starch derivatives; and synthetic hydrophilic polymeric substances such as polyvinyl alcohol, polyvinyl alcohol partial acetal, poly-N-vinylpyrrolidone, polyacrylic acid, polymethacrylic acid (or a product obtained by esterifying polyacrylic acid or polymethacrylic acid with glycidyl acrylate or glycidyl methacrylate), polyacrylamide, polyvinylimidazole, or polyvinyl pyrazole, etc.; or co-polymers thereof.

Examples of useful gelatins include lime-treated gelatin as well as acid-treated gelatin, and hydrolytic decomposition products of gelatin and enzymatic decomposition products of gelatin can also be used. Examples of gelatin derivatives include substances produced by reacting gelatin with various compounds, such as acid halide, acid anhydride, isocyanates, bromoacetic acid, alkanesultones, vinylsulfonamides, maleinimides, polyalkylene oxides, epoxy compounds, etc. Examples thereof are described in U.S. Pat. Nos. 2,614,928, 3,132,945, 3,186,846 and 3,312,553, British Pat. Nos. 861,414, 1,033,189, and 1,005,784, and Japanese Patent Publication No. 26845/67.

Examples of useful graft polymers of gelatin include those prepared by grafting gelatin with homopolymers or copolymers of vinyl monomers such as acrylic acid, methacrylic acid or derivatives thereof such as esters or amides, acrylonitrile, styrene, etc. Particularly, graft polymers of gelatin with polymers having a degree of compatibility with gelatin, such as polymers of acrylic acid, methacrylic acid, acrylamide, methacrylamide, hydroxyalkyl methacrylate, or the like are preferably used. Examples thereof are described in U.S. Pat. Nos. 2,763,625, 2,831,767, 2,956,884, etc. Typical synthetic hydrophilic polymeric substances are those described, for example, in German Patent Application (OLS) No. 2,312,708, U.S. Pat. Nos. 3,620,751 and 3,879,205 and Japanese Patent Publication NO. 7561/68.

The phenol compounds which can be used in the present invention can be represented by the general formula (I) described above. Among these compounds, those in which $R_2$ and $R_2'$ each represents hydrogen, an alkyl group having 1 to 6 carbon atoms, a substituted alkyl group having 2 to 12 carbon atoms, an aryl group having 6 to 12 carbon atoms, a substituted aryl group having 7 to 18 carbon atoms or an aralkyl group having 7 to 18 carbon atoms and $R_3$ and $R_3'$ each represents hydrogen, an alkyl group having 1 to 6 carbon atoms, a substituted alkyl group having 2 to 12 carbon atoms, an aryl group having 6 to 12 carbon atoms, a substituted aryl group having 7 to 18 carbon atoms, an aralkyl group having 7 to 18 carbon atoms, an alkoxy group having 1 to 6 carbon atoms or a thioalkyl group having 1 to 6 carbon atoms are more preferred in view of the effects according to the present invention.

Preferred examples of the phenol compounds useful in the present invention are set forth below, but the present invention is not to be construed as being limited thereto.

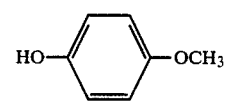

1.

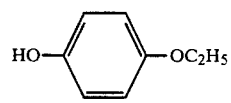

2.

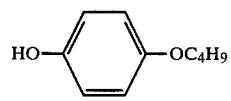

3.

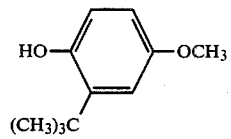

4.

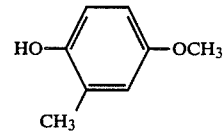

5.

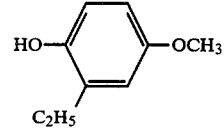

6.

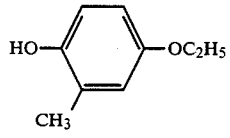

7.

-continued

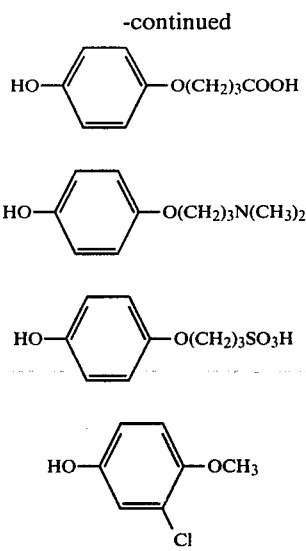

Particularly preferred examples of the phenol compounds useful in the present invention are Compounds 1, 2, 3, 5, 6 and 7, among the above described compounds.

The hydrazine compounds which can be used in the present invention can be represented by the general formula (II) described above or a salt thereof.

Preferred examples of the hydrazine compounds useful in the present invention are set forth below, but the present invention is not to be construed as being limited thereto.

| | |
|---|---|
| $NH_2NH_2 \cdot H_2SO_4$ | 1. |
| $NH_2NH_2 \cdot C_4H_6O_6$ | 2. |
| $H_3CNHNN_2$ | 3. |
| $HOC_2H_4NHNH_2$ | 4. |

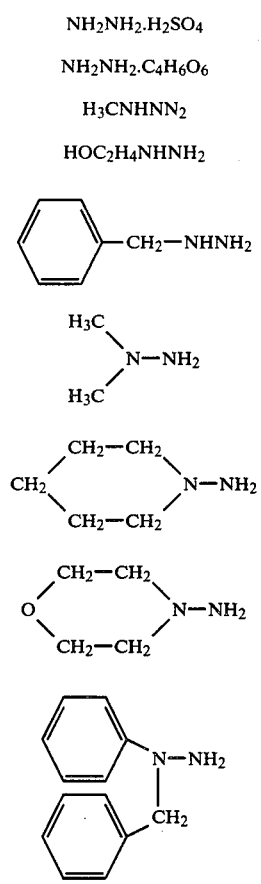

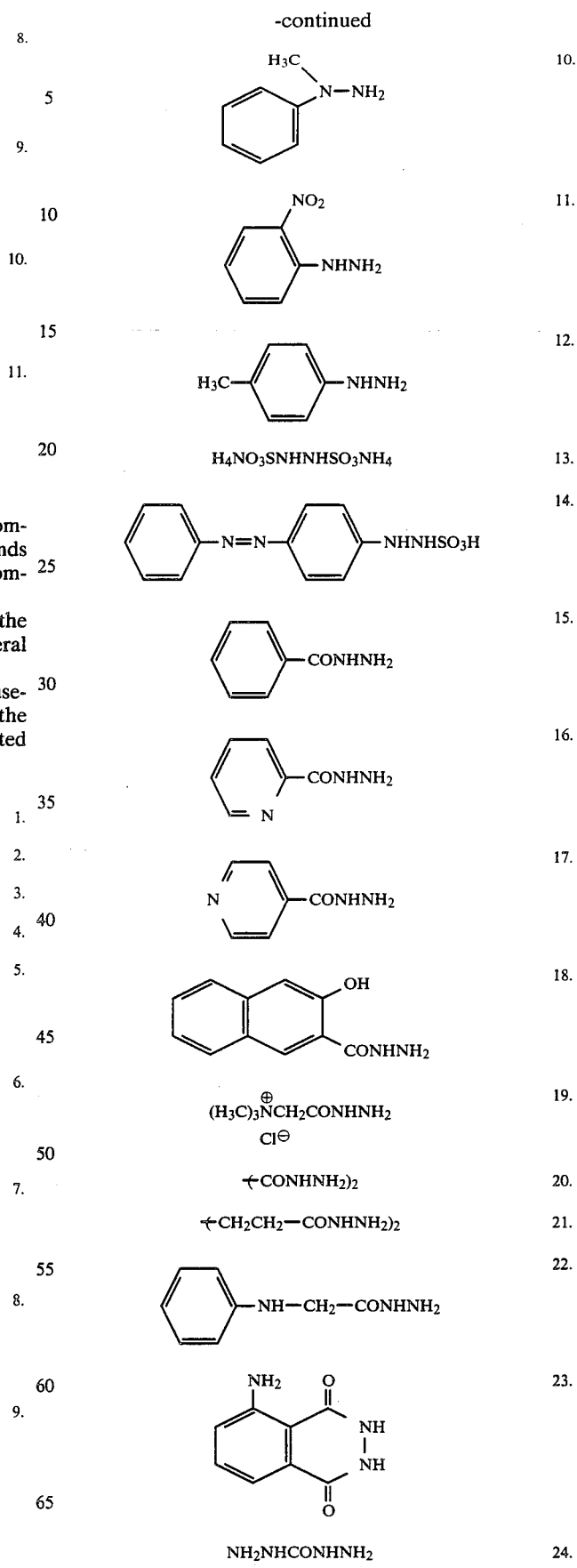

| | |
|---|---|
| $H_4NO_3SNHNHSO_3NH_4$ | 13. |
| $NH_2NHCONHNH_2$ | 24. |

-continued

25. 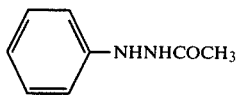

26. 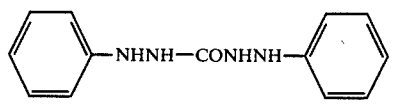

27. 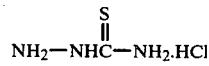

28. 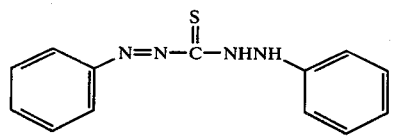

29. 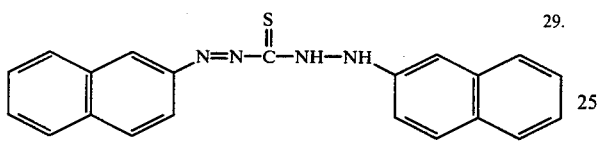

30. 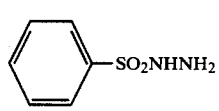

31. 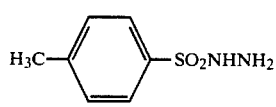

32. 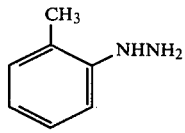

33. 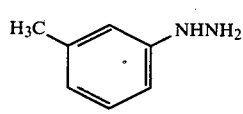

34. 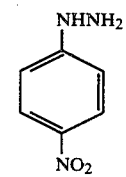

35. 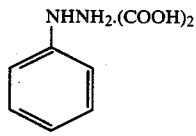

36. 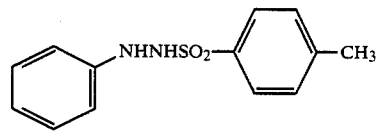

-continued

37. 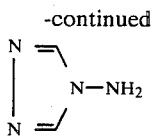

38. 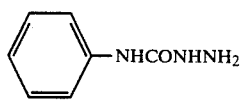

39. 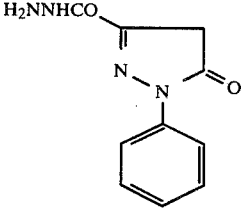

40. 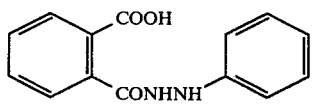

41. 

42. 

43. 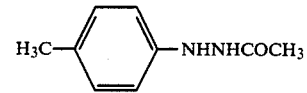

44. 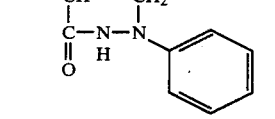

Among the above described compounds, more preferred examples of the hydrazine compounds useful in the present invention are Compounds 3, 4, 5, 11, 12, 15, 16, 18, 20, 21, 25, 32, 33 and 43. Particularly preferred examples of the hydrazine compounds useful in the present invention are Compounds 3, 5, 12, 15, 25, 32 and 43.

The phenol compounds used in the present invention have an oxidation-reduction potential higher than conventional developing agents for silver halide emulsions such as hydroquinone, catechol, Methol, p-phenylenediamine, etc., and hardly reduce the silver halide. Therefore, it is rarely the case that these phenol compounds are utilized for development of conventional silver halide emulsions. Further, the phenol compounds according to the present invention have been generally used as polymerization inhibitors for improving preservability of monomers or as an antioxidant for plastics or rubbers, etc., as described in U.S. Pat. No.

3,697,275, etc., but there is no case in which they have been used as a polymerization initiator.

The above described U.S. Pat. No. 3,746,542 discloses that p-methoxyphenol may be added. However, the compound is used as a polymerization inhibitor in this reference. There is no description which indicates that p-methoxyphenol accelerates the polymerization reaction. In particular, a hydrazine derivative is used as a polymerization initiator and p-methoxyphenol is used as a polymerization inhibitor in U.S. Pat. No. 3,746,542, but the super-additivity in a development polymerization rate is not described at all. The "super-additivity" means that the high development polymerization rate unexpected from the results obtained by using either of phenols and hydrazines is obtained by the synergistic effects of the phenols and the hydrazines.

It is, therefore, completely unexpected that p-methoxyphenol which has been used as a polymerization inhibitor can be used as a polymerization initiator. When the phenol compound according to the present invention is used alone, a higher development polymerization rate can be obtained in comparison with the case wherein a resorcinol or hydrazine derivative is used. It is quite surprising that the super-additivity is recognized and thus further improvement in the development polymerization rate can be achieved by the combination use of the phenol compound and the hydrazine compound according to the present invention.

The reaction mechanism by which polymerization of non-gaseous ethylenically unsaturated compounds is caused as a result of reduction of silver halide by the above described phenol compounds is not yet fully understood. However, it is believed that the polymerization may proceed by a free-radical mechanism, because compounds capable of carrying out free-radical polymerization can be generally utilized, the reaction proceeds in aqueous solution and oxygen acts to retard the polymerization reaction. It is not clear whether free-radicals are formed directly by the reaction of the above described phenol compounds with silver halide, or if the free-radicals are generated by interaction of water and oxygen in the system. Since the polymerization is not observed when adding the non-gaseous ethylenically unsaturated compounds to the system after the exposed silver halide is reduced by the above described phenol compounds, it appears that the polymerization of the non-gaseous ethylenically unsaturated compounds is caused in situ simultaneously with reduction of the silver halide. Accordingly, it is believed that an intermediate product of silver halide and the above described phenol compound according to the present invention contributes to the reaction.

The reaction mechanism by which the development polymerization rate is increased as a result of the super-additivity is obtained by the combined use of the phenol compound and the hydrazine compound according to the present invention.

According to the so-called tanning development process, wherein cross-linking of gelatin is carried out by an oxidation product of a well known developing agent as a process for forming polymeric images utilizing light sensitivity of silver halide, the formed images are limited to cross-linked materials of gelatin. However, in polymeric images obtained according to the present invention, since those having various properties can be obtained according to the particular non-gaseous ethylenically unsaturated compound used, it is possible to obtain desired properties which cannot be obtained by cross-linked materials of gelatin, such as with respect to dyeing ability, chemical resistance, etc.

Further, in the process of the present invention, polymerization of non-gaseous ethylenically unsaturated compounds is accelerated when sulfite ions are present in the system.

The sulfite ions may be added as a compound which initially includes sulfite ion, such as a sulfite or bisulfite of alkali metal or ammonium, or may be added as a material which forms sulfite ions by decomposition in the aqueous solution, such as a pyrosulfite of alkali metal or ammonium, or adducts of bisulfite and aldehydes such as formaldehyde or glyoxal. Although the amount of sulfite ions to be added varies according to the kinds and the amounts of the phenol compounds, the hydrazine compounds and the non-gaseous ethylenically unsaturated monomers used, pH of the system, etc., it is generally effective in an amount of at least 0.002 mol, and preferably at least 0.01 mol, per liter of the reaction system.

It is well known to add sulfites to photographic developing solutions. In this case, the sulfites are believed to prevent autoxidation of the developing agent such as hydroquinone or p-aminophenol by reacting with an oxidation product of the developing agent, and to prevent uneven development reaction, as described, for example, in C.E.K. Mees, *The Theory of the Photographic Process*, 2nd Edition, page 652, published by Macmillan Co. (1954).

In the present invention, intermediate products formed by oxidation of the phenol compounds and the hydrazine compounds by silver halide are believed to initiate the polymerization. Accordingly, it should be noted that the effect of accelerating the polymerization by sulfites by basically different from the function of removing oxidation products in the case of a conventional developing solution.

If the sulfites merely removed the oxidation products, the polymerization would be retarded rather than accelerated. Further, since the sulfites are known reducing agents for an oxidation-reduction reaction, polymerization by the system of silver halide-sulfite ion would be expected. However, as a result of experiments according to the present invention, the polymerization by sulfites can be nearly disregarded when the phenol compounds and the hydrazine compounds according to the present invention are not present.

Although the mechanism of the sulfites in the present invention is not clear, it is reasonable to suppose that the sulfites prevent interference with the polymerization reaction by oxygen.

The non-gaseous ethylenically unsaturated compounds used in the present invention are compounds capable of causing addition polymerization, and may be liquid or solid at room temperature. Mixtures of such compounds can be used, if desired. Examples of such compounds include acrylamide, acrylonitrile, N-hydroxymethylacrylamide, methacrylamide, N-t-butylacrylamide, methacrylic acid, acrylic acid, calcium acrylate, aluminum acrylate, sodium acrylate, methacrylamide, methyl methacrylate, methyl acrylate, ethyl acrylate, 2-acrylamido-2-methylpropanesulfonic acid, vinylpyrrolidone, 2-vinylpyridine, 4-vinylpyridine, 2-methyl-N-vinylimidazole, potassium vinylbenzenesulfoante and vinylcarbazole, etc.

In the present invention, it is particularly advantageous to use compounds having two or more functional groups, and preferably the above described compounds having one functional group are used together therewith, or compounds having two or more functional groups are used alone or in mixture. Examples of such compounds include N,N'-methylenebisacrylamide; ethylene glycol dimethacrylate; diethylene glycol dimethacrylate, triethylene glycol dimethacrylate; polyethylene glycol dimethacrylate; divinyl ether; divinylbenzene bisphenol A dimethacrylate; trimethylolpropane triacrylate; pentaerythritol tetraacrylate; bisoxyethylenated bisphenol A diacrylate; urethane group-containing unsaturated monomers, for example, reaction products of diol monoacrylate (or methacrylate) and diisocyanate, such as di(2'-methacryloxyethyl)-2,4-tolylenediurethane or di(2'-acryloxyethyl)trimethylenediurethane; etc.

In the present invention, water-soluble non-gaseous ethylenically unsaturated compounds may be used, or water-insoluble non-gaseous ethylenically unsaturated compounds may be added as an emulsion or as a solution prepared by dissolving them in a suitable solvent, to carry out the polymerization. Emulsification can be carried out by means of a suitable stirring apparatus in the presence of a surface active agent and/or a polymeric compound according to the conventional method.

This reaction generally proceeds well in an alkaline state. The most suitable pH depends upon the kind and the concentration of silver halide, phenol compound(s), hydrazine compound(s), and the hydrophilic or hydrophobic polymeric binder(s) conventionally used during film formation and the reaction temperature, and the reaction is able to proceed at a pH of 8 or more, preferably at a pH of 9 or more.

When using a photographic emulsion applied to a support, the resulting light-sensitive material may be dipped in an aqueous alkaline solution after irradiation with electromagnetic radiation or corpuscular radiation, by which the reaction proceeds. The reducing agents or non-gaseous ethylenically unsaturated compounds may be incorporated in this aqueous alkaline solution or may be incorporated in the photographic light-sensitive material.

The reaction is easily stopped by acidifying the system, for example, to a pH of 5 or less. However, the reaction can also be stopped by cooling, removal of reacting materials by washing, dissolution of silver halide by a photographic fixing solution or addition of a polymerization inhibitor to the system.

When incorporating the non-gaseous ethylenically unsaturated compound monomers in the photographic light-sensitive material, it is preferred that the amount of non-gaseous ethylenically unsaturated compound to be used is from 1/30 to 30 times, and more preferably from ¼ to 4 times, the weight of the hydrophilic or hydrophobic polymeric binders conventionally added during film formation. Further, it is preferred that the weight of silver halide is from 1/1,000 to 2 times, and more preferably from 4/1,000 to ½ times the weight of the hydrophilic or hydrophobic polymeric binders conventionally added during film formation. When the phenol compounds and the hydrazine compounds according to the present invention are added to the photographic light-sensitive material, and the non-gaseous ethylenically unsaturated compounds, phenol compounds and hydrazine compounds are contained in the same layer, the phenol compound is present in an amount of 3 parts by weight or more, and preferably 4 parts by weight or more per 100 parts by weight of the non-gaseous ethylenically unsaturated compounds used. On the other hand, when the phenol compounds and the non-gaseous ethylenically unsaturated compounds are contained in different layers, respectively, the phenol compound is preferred to be used in an amount of from 1/10 mols to 20 mols per mol of silver halide used. In both cases the hydrazine compounds are preferably used in an amount of from 1/10,000 to 2 times by mol and particularly from 1/1,000 to ½ times by mol per mol of the phenol compounds used. The phenol compounds and the hydrazine compounds may be added at the time of preparing the photographic light-sensitive material, after dissolving in water or an organic solvent with or without adding a suitable surface active agent.

When the non-gaseous ethylenically unsaturated compounds are added to the processing solution, it is preferred, if possible, that the concentration is higher, and the amount to be added to the solution is rather restricted by the solubility of the non-gaseous ethylenically unsaturated compounds used in the processing solution. When the phenol compounds and the hydrazine compounds used as a reducing agent are added to the processing solution, the optimum amount thereof varies more or less according to the kind thereof, but a concentration of the phenol compounds is preferred to be in a range of from 1/1,000 mols to 5 mols, and more preferably from 1/50 mols to 1 mol per liter of solution. Furthermore, the phenol compounds are preferably present in an amount of at least 3 parts by weight, more preferably 4 parts by weight, per 100 parts by weight of non-gaseous ethylenically unsaturated compounds. Also, the hydrazine compounds are preferably used in a range from 1/10,000 mols to 2 mols and particularly from 1/1,000 mols to ½ mols to mol of the phenol compounds used. Further, the phenol compounds and hydrazine compounds may be added as an aqueous solution or a solution in an organic solvent or they may be solubilized in an aqueous solution by adding a surface active agent.

When the phenol compounds are added, if only the molar amounts thereof are kept constant, the performance is hardly varied, no matter what phenol compounds are selected and no matter how the phenol compounds are combined. This effect also holds, when the hydrazine compounds are added in place of phenol compound.

In the present invention the phenol compounds and the hydrazine compounds can be naturally coexistent in the same layer or in a processing solution. Also, it is possible to separately add these compounds to different layers or to a photographic light-sensitive material and a processing solution.

The photographic light-sensitive material used according to the present invention may contain inorganic or organic hardening agents. Examples thereof include chromium salts (chromium alum, chromium acetate, etc.), aldehydes (formaldehyde, glyoxal, glutaraldehyde, etc.), N-methylol compounds (dimethylolurea, methyloldimethylhydantoin, etc.), dioxane derivatives (2,3-dihydroxydioxane, etc.), active vinyl compounds (1,3,5-triacryloylhexahydro-s-triazine, bis(vinylsulfonyl)methyl ether, etc.), active halogen compounds (2,4-dichloro-6-hydroxy-s-triazine, etc.), mucohalogenic acids (mucochloric acid, mucophenoxychloric acid, etc.), isoxazoles, dialdehyde starch, 2-chloro-6-hydroxytriazinyl gelatin, etc., which may be used alone or as a combination thereof. Specific examples thereof are described, for example, in U.S. Pat. Nos. 1,870,354, 2,080,019, 2,726,162, 2,870,013, 2,983,611, 2,992,109, 3,047,394, 3,057,723, 3,103,437, 3,321,313, 3,325,287, 3,362,827, 3,539,644 and 3,543,292, British Pat. Nos. 676,628, 825,544 and 1,270,578, German Pat. Nos. 872,153 and 1,090,427, and Japanese Patent Publication Nos. 7133/59 and 1872/71, etc.

The photographic light-sensitive materials used in the present invention may contain various known surface active agents for various purposes, for example, as a coating assistant, antistatic agent, for improvement of lubrication property, for emulsification and dispersion, for prevention of adhesion, etc.

For example, it is possible to use nonionic surface active agents such as saponin (steroid), alkylene oxide derivatives (for example, polyethylene glycol, polyethylene glycol/polypropylene glycol condensate, polyethylene glycol alkyl ether, polyethylene glycol alkylaryl ether, polyethylene glycol esters, polyethylene glycol sorbitan esters, polyalkylene glycol alkylamines or amides, and polyethylene oxide addition products of silicone, etc.), glycidol derivatives (for example, alkenylsuccinic acid polyglyceride and alkylphenol polyglyceride), aliphatic acid esters of polyhydric alcohols, alkyl esters of sugar, urethanes of sugar, ethers of sugar, etc.; anionic surface active agents containing acid groups such as a carboxyl group, a sulfo group, a phospho group, a sulfuric acid ester group, a phosphoric acid ester group, etc., such as triterpenoid saponin, alkylcarboxylic acid salts, alkylsulfonic acid salts, alkylbenzenesulfonic acid salts, alkylnaphthalenesulfonic acid salts, alkylsulfuric acid esters, alkylphosphoric acid esters, N-acyl-N-alkyltaurines, sulfosuccinic acid esters, sulfoalkylpolyoxyethylenealkylphenyl esters, polyoxyethylenealkylphosphoric acid esters, etc.; amphoteric surface active agents such as amino acids, aminoalkylsulfonic acids, aminoalkylsulfuric or phosphoric acid esters, alkylbetaines, amine imides, amine oxides, etc.; and cationic surface active agents such as alkylamine salts, aliphatic quaternary ammonium salts, aromatic quaternary ammonium salts, heterocyclic quaternary ammonium salts such as pyridinium or imidazolium salt, etc., aliphatic or heterocyclic phosphonium salts, aliphatic or heterocyclic sulfonium salts, etc.

Specific examples of these surface active agents have been described, for example, in U.S. Pat. Nos. 2,240,472, 2,831,766, 3,158,484, 3,210,191, 3,294,540 and 3,507,660, British Pat. Nos. 1,012,495, 1,022,878, 1,179,290 and 1,198,450, Japanese Patent Application (OPI) No. 117414/75 (the term "OPI" as used herein refers to a "published unexamined Japanese patent application"), U.S. Pat. Nos. 2,739,891, 2,823,123, 3,068,101, 3,415,649, 3,666,478 and 3,756,828, British Pat. No. 1,397,218, U.S. Pat. Nos. 3,133,816, 3,441,413, 3,475,174, 3,545,974, 3,726,683 and 3,843,368, Belgian Pat. No. 731,126, British Pat. Nos. 1,138,514, 1,159,825 and 1,374,780, Japanese Patent Publication Nos. 378/65, 379/65 and 13822/68, U.S. Pat. Nos. 2,271,623, 2,288,226, 2,944,900, 3,253,919, 3,671,247, 3,772,021, 3,589,906, 3,666,478 and 3,754,924, West German Patent Application (OLS) No. 1,961,638 and Japanese Patent Application (OPI) No. 59025/75, etc.

In the photographic light-sensitive materials prepared according to the present invention, a silver halide photographic emulsion layer and other layers are formed by applying the layer compositions to flexible supports conventionally used for photographic light-sensitive materials, such as plastic films, paper or cloth, etc., or rigid supports such as glass, porcelain or metal, etc. Materials useful as the flexible supports include films composed of semi-synthetic or synthetic polymeric materials such as cellulose nitrate, cellulose acetate, cellulose acetate butyrate, polystyrene, polyvinyl chloride, polyethylene terephthalate, or polycarbonate, etc., and coated or laminated papers having a baryta layer, an $\alpha$-olefin polymer layer (for example, polyethylene, polypropylene or ethylene/butene copolymer), etc. The supports may be colored with dyestuffs or pigments. For the purpose of light-shielding, they may be blackened. The surface of these supports is generally subjected to undercoating treatment in order to improve adhesion to the photographic emulsion layers, etc. The surface of the supports may be subjected to corona discharge treatment, application of ultraviolet rays or flame treatment, etc., before or after the undercoating treatment.

Examples of electromagnetic radiation or corpuscular radiation capable of being used to obtain photographic images in the present invention include any electromagnetic wave or corpuscular radiation which sensitizes conventional photographic emulsions. More particularly, it is possible to use visible rays, ultraviolet rays, infrared rays of $1.3\mu$ or less, X-rays, gamma rays, and corpuscular radiation such as electron rays, alpha rays, etc. Thus, it is possible to use conventional means, namely, various kinds of known light sources such as a tungsten lamp, a fluorescent lamp, a mercury lamp, a xenon arc lamp, a carbon arc lamp, a xenon flash lamp, a halogen lamp, a luminescent diode, a cathode-ray tube flying spot, a discharge tube such as a glow tube, a laser ray such as an argon laser, etc. Exposing to light can be carried out not only for an exposure time in a range of 1/1,000 second to 50 seconds, but also for a short exposure time of less than 1/1,000 second, for example, $1/10^4$ to $1/10^6$ second in the case of using a xenon flash lamp, a cathode-ray tube, or a laser ray, or for a long exposure time of more than 50 seconds. If desired, the spectral composition of light used for exposure can be controlled by color filters.

When utilizing the process of the present invention for recording images, it is possible to utilize differences of physical and chemical properties such as solubility, light-scattering, and adhesive property, a dyeing property, etc., between the non-gaseous ethylenically unsaturated compounds and the polymer thereof in various ways. By utilizing a difference of solubility, images can be formed by removing the parts which do not polymerize after carrying out the exposure and the reaction so that images composed of a polymeric substance remain only on the parts which have been subjected to imagewise exposure.

In this case, it is advantageous that other hydrophilic or hydrophobic polymeric binders conventionally used during film formation are removed by dissolution together with the unreacted monomers. Therefore, it is preferred that the hydrophilic or hydrophobic polymeric binders originally contained in the system are the so-called two-dimensional linear high molecular compounds which are hardly cross-linked, or polymeric compounds wherein main chains or bridges can be easily broken, while the high molecular compound formed by the reaction is the so-called three-dimensional polymer. Accordingly, it is preferred to use the above described compounds having a plurality of functional groups alone or together with compounds having one functional group. However, even if the formed high molecular substance is a two-dimensional soluble, polymeric substance, solubility of the parts where the polymeric substance is formed is often quite different from that of the parts where such a substance is not formed, as a result of an interaction with the polymeric binders originally contained. Accordingly, it is not as essential requirement to use monomers having a plurality of functional groups.

The images composed of the polymeric substance formed according to the process of the present invention can be utilized for various printing processes.

Further, the present invention can be utilized for processes for forming dye images. In such processes, monomers having a group capable of carrying an electric charge by ionization or addition of a hydrogen cation are used as the non-gaseous ethylenically unsaturated compound monomers to form a polymer capable of carrying electric charges by ionization or addition of hydrogen cations, and the formed images are selectively dyed with a coloring material having electric charges having the reverse polarity. Further, it is possible to transfer the resulting dye images to other supports by various processes.

As the addition-polymerizable non-gaseous ethylenically unsaturated compounds capable of carrying an electric charge by ionization or addition of a hydrogen cation which can be utilized in the above described case, there are those from which a polymeric compound carrying negative electric charges is formed, for example, non-gaseous ethylenically unsaturated compounds having carboxyl groups such as acrylic acid, methacrylic acid, itaconic acid of maleic acid, non-gaseous ethylenically unsaturated compounds having metal salt or ammonium salt of carboxyl groups such as ammonium acrylate, sodium acrylate, potassium acrylate, calcium acrylate, magnesium acrylate, zinc acrylate, cadmium acrylate, sodium methacrylate, calcium methacrylate, magnesium methacrylate, zinc methacrylate, cadmium methacrylate, sodium itaconate or sodium maleate, non-gaseous ethylenically unsaturated compounds having sulfonic acid groups such as vinylsulfonic acid or p-vinylbenzenesulfonic acid, and non-gaseous ethylenically unsaturated compounds having metal salt or ammonium salt of sulfonic acid groups such as ammonium vinylsulfonate, sodium vinylsulfonate, potassium, vinylsulfonate, and potassium p-vinylbenzenesulfonate, and those from which a polymeric compound carrying positive electric charges is formed, for example, non-gaseous ethylenically unsaturated compounds having basic nitrogen atoms such as 2-vinylpyridine, 4-vinylpyridine, 5-vinyl-2-methylpyridine, N,N-dimethylaminoethyl acrylate, N,N-dimethylaminoethyl methacrylate, N,N-diethylaminoethyl acrylate, and N,N-diethylaminoethyl methacrylate, and non-gaseous ethylenically unsaturated compounds having a quaternary salt of nitrogen produced by reacting the above described non-gaseous ethylenically unsaturated compounds with methyl chloride, ethyl bromide, dimethyl sulfate, diethyl sulfate, methyl p-toluenesulfonate, etc. Such compounds are readily commercially available, and processes for synthesizing them are well known. These compounds may be used alone or may be used as a mixture of two or more thereof. Further, they may be used together with water-soluble addition-polymerizable non-gaseous ethylenically unsaturated compounds which do not carry electric charges. Examples of such non-gaseous ethylenically unsaturated compounds capable of use together include acrylamide, N-hydroxymethyl acrylamide, methacrylamide, methyl methacrylate, vinylpyrrolidone, N,N-methylenebisacrylamide, triethylene glycol dimethacrylate, polyethylene glycol dimethacrylate, etc. When these compounds are used together with the non-gaseous ethylenically unsaturated compounds which do not carry electric charges, it is necessary to pay attention to the relationship between the reactivity and the amount of the non-gaseous ethylenically unsaturated compounds, so as not to form a polymer which does not substantially contain ionizing groups due to polymerization of only compounds which do not carry electric charges.

Conventional acid and basic dyestuffs capable of carrying electric charges by ionization can be utilized in the above described case. When using non-gaseous ethylenically unsaturated compounds which form a polymeric compound carrying negative electric charges, basic dyestuffs can be used. When using non-gaseous ethylenically unsaturated compounds which form a polymeric compound carrying positive electric charges, acid dyestuffs can be used. That is, the polymeric compound carrying negative electric charges is particularly well colored with the basic dyestuffs, because the dyestuff molecule has positive electric charges. On the other hand, the polymeric compound carrying positive electric charges is particularly well colored with acid dyestuffs, because the dyestuff molecule has negative electric charges. Accordingly, dye images corresponding to an imagewise formed polymeric compound can be obtained.

When using gelatin as a binder for the photographic emulsion, dyeing should be carried out taking the isoelectric point of gelatin into consideration, because gelatin is an amphoteric electrolyte. Namely, gelatin has negative electric charges at a pH higher than the isoelectric point thereof and has positive electric charges at a pH lower than the isoelectric point thereof. Accordingly, when forming a polymeric compound which has negative electric charges, only such polymeric images are dyed without dyeing gelatin, if dyeing is carried out using basic dyestuffs at a pH lower than the isoelectric point of gelatin. Furthermore, if the layer is uniformly dyed at a pH higher than the isoelectric point of gelatin and then washed with a washing solution having a pH lower than the isoelectric point of gelatin, the parts where polymer images are not formed can be washed out and parts of polymer images remain as a colored image. When dyeing the polymer images having positive electric charges using acid dyestuffs, dyeing is preferably carried out at a pH higher than the isoelectric point of gelatin. Of course, if the pH is too high or too low, solubility of the dyestuffs is reduced or ionization of a polymer to be charged is inhibited. The most suitable range of pH varies according to the particular non-gaseous ethylenically unsaturated compounds to be used, the kind of dyestuffs or the kind of binders such as gelatin. For gelatin, it is generally preferred that, when lime-processed gelatin having an isoelectric point of about 4.9 is used, the pH is 2.5 to 4.5 when dyeing a polymer compound having negative electric charges with a basic dyestuff, and the pH is 5.0 to 8.0 when dyeing a polymer compound having positive electric charges with an acid dyestuff. Examples of dyestuffs which can be used include C.I. Acid Yellow 7 (C.I. 56205), C.I. Acid Yellow 23 (C.I. 19140), C.I. Acid Red 1 (C.I. 18050), C.I. Acid Red 52 (C.I. 45100), C.I. Acid Blue 9 (C.I. 42090), C.I. Acid Blue 45 (C.I. 63010), C.I. Acid Blue 62 (C.I. 62045) and C.I. Acid Violet 7 (C.I. 18055), etc., as acid dyestuffs, and C.I. Basic Yellow 1

(C.I. 49005), C.I. Basic Yellow 2 (C.I. 41000), C.I. Basic Red 1 (C.I. 45160), C.I. Basic Red 2 (C.I. 50240), C.I. Basic Blue 25 (C.I. 52025), C.I. Basic Violet 3 (C.I. 42555) and C.I. Basic Violet 10 (C.I. 45170) as basic dyestuffs. The numbers of the above described dyestuffs refer to those in the *Color Index*, 2nd Edition. These dyestuffs have been available in the market as various trade names.

When utilizing this process, it is necessary that a reduction polymerization reaction is carried out after irradiation with electromagnetic waves or corpuscular radiation, and dyeing is then carried out.

After carrying out the irradiation, reduction and polymerization, it is possible to isolate the polymer images by washing out only the non-gaseous ethylenically unsaturated compound monomers which were not polymerized. The polymer is generally difficult to dissolve as compared with monomers, and the polymer hardly diffuses into the gelatin layer in cases wherein hydrophilic polymeric binders originally incorporated for preparing the silver halide photographic emulsion remain without dissolving in water such as gelatin, and, consequently, polymerized parts remain to form images. If monomers having two or more functional groups are mixed, it is possible to further enhance insolubility and nondiffusibility of the polymer.

If dyeing is carried out as described above after carrying out polymerization, dye images combined with the polymer images can be obtained. These dye images can be utilized as brilliant dye images when they are subjected to a fixing operation to remove silver halide, and, further, silver images are removed by dissolution using an oxidizing agent and a solvent for silver salts. When using a reducing agent showing an extraordinarily good polymerization initiating efficiency, it is sometimes unnecessary or almost unnecessary to remove the silver images by oxidation, because the polymerization reaction occurs such that only a very small amount of reduction silver is formed.

Moreover, the resulting dye images can be transferred onto other supports. Transfer can be carried out by dampening a layer having dye images formed as described above with a solvent for dyes such as methanol, water, or an aqueous solution of acid, base or salt, and closely contacting with a support to be transcribed. Examples of useful supports to be transcribed include conventional paper, paper coated with a hydrophilic polymer layer or a gelatin layer and films coated with a hydrophilic polymer layer or a gelatin layer, etc. When transferring to a support coated with a gelatin layer, it is preferred to use a support mordanted with, e.g., an aluminum salt, etc., similar to those used in known dye transfer processes. When images of a polymer capable of carrying electric charges are once formed, a plurality of copies can be obtained by carrying out dyeing and transferring as described above. Several transfer images can be obtained by one dyeing operation. Further, since the polymer images can be repeatedly dyed many times, a large numbers of copies can be easily produced.

The present invention is illustrated in greater detail with reference to the following examples, but the present invention is not to be construed as being limited thereto.

EXAMPLE 1

A silver halide emulsion comprising 75 mol% silver chloride, 24.5 mol% silver bromide, and 0.5 mol% silver iodide was prepared using acid-processed gelatin, and it was subjected to sulfur sensitization or gold sensitization by a conventional method. The average particle size (diameter) of silver halide particles was 0.20 μm. After both faces of a polyethylene terephthalate support were coated with a subbing layer, an antihalation layer was applied to one face thereof. Thereafter, the above described silver halide emulsion to which a merocyanine dyestuff having a sensitivity maximum of 550 mμ was added as a sensitizing dyestuff, mucochloric acid was added as a hardening agent in an amount of about 1.5 g per 100 g of gelatin and a suitable stabilizer and surface active agent were added, was applied to the other face of the support so as to form a layer containing 0.2 g of silver and 4 g of gelatin per square meter. Further, to the resulting emulsion layer, a protective layer composed of about 0.8 μm of gelatin was applied to produce a coating sample.

This sample was brought into close contact with a step wedge having a step difference of 0.15 (Δ log E) and exposed to light for 1 second by a white tungsten light (2,860° K.) of 200 luxes. It was then dipped in the following developing solution at 40° C. for 2 minutes under a red safety light.

| | |
|---|---|
| 2-Acrylamido-2-methylpropanesulfonic acid | 250 g |
| Sodium sulfite | 7 g |
| Anhydrous sodium carbonate | 5 g |
| Reducing agent: Phenol compound (described in Table 1) Hydrazine compound (described in Table 1) | |
| pH was adjusted to 10.2 with sodium hydroxide, and water was added to make 1 liter. | |

After washing with water, it was fixed with the following fixing solution.

| | |
|---|---|
| Sodium thiosulfate (anhydrous) | 150 g |
| Potassium metabisulfite | 15 g |
| Water to make | 1 liter |

The sample sufficiently fixed and washed with water was dipped in a 0.1% aqueous solution of the red basic dyestuff: Rhodamine 6 G.C.P. (C.I. Basic Red 1) for 5 minutes and allowed to stand at room temperature. Then, the sample was washed with water by which excess dyestuff was removed and the red dyestuff stuck on the imagewise polymer to form a red image. Reduction silver was removed from a resulting red image by oxidizing using Farmer's reducer to obtain a brilliant red image.

The optical density of this red image to green light was measured. A reciprocal of exposure necessary to give a density of 2.0 was defined as a standard sensitivity, and relative sensitivities based on the sensitivity of Example No. 6 being 100 were set forth in Table 1 below.

TABLE 1

| No. | Reducing Agent | Amount Added (g) | Hydrazine Compound | Amount Added (g) | Relative Sensitivity | Note |
| --- | --- | --- | --- | --- | --- | --- |
| 1 | Compound 1 | 12.4 | Compound 1 | 0.39 | 85 | Present Invention |
| 2 | Compound 1 | 12.4 | Compound 5 | 0.33 | 80 | " |
| 3 | Compound 1 | 12.4 | Compound 25 | 0.41 | 90 | " |
| 4 | Compound 1 | 12.4 | Compound 32 | 0.33 | 80 | " |
| 5 | Compound 2 | 13.8 | Compound 1 | 0.39 | 105 | " |
| 6 | Compound 2 | 13.8 | Compound 5 | 0.33 | 100 | " |
| 7 | Compound 2 | 13.8 | Compound 25 | 0.41 | 110 | " |
| 8 | Compound 2 | 13.8 | Compound 32 | 0.33 | 100 | " |
| 9 | Compound 3 | 16.6 | Compound 5 | 0.33 | 90 | " |
| 10 | Compound 3 | 16.6 | Compound 25 | 0.41 | 100 | " |
| 11 | Compound 5 | 13.9 | Compound 5 | 0.33 | 80 | " |
| 12 | Compound 5 | 13.9 | Compound 25 | 0.41 | 90 | " |
| 13 | Compound 1 | 12.4 | — | — | 40 | Comparison |
| 14 | Compound 2 | 13.8 | — | — | 50 | " |
| 15 | Compound 3 | 16.6 | — | — | 50 | " |
| 16 | Compound 5 | 13.9 | — | — | 40 | " |
| 17 | — | — | Compound 1 | 13.0 | 5 | " |
| 18 | — | — | Compound 5 | 11.0 | 10 | " |
| 19 | — | — | Compound 25 | 13.8 | 15 | " |
| 20 | — | — | Compound 32 | 11.0 | 5 | " |

It is apparent from the results as shown in Table 1 above that Samples No. 1 to No. 12 which contain both the phenol compound and the hydrazine compound according to the present invention exhibit high sensitivity in comparison with Samples No. 13 to No. 16 containing only the phenol compound and Samples No. 17 to No. 20 containing only the hydrazine compound.

EXAMPLE 2

Samples were prepared in the same manner as in Example 1, except that a solution obtained by dissolving the reducing agent in methanol and adding thereto sodium dodecylbenzenesulfonate was added during preparation of a coating solution for the light-sensitive material. The amount of the reducing agent added was equal to the moles of silver halide, and the amount of silver coated was 0.2 g/m². These samples were processed in the same manner as in Example 1 except that the reducing agent was removed from the developing solution of Example 1, and sensitivity was measured. Relative sensitivities based on the sensitivity of Sample No. 23 being 100 are shown in Table 2 below.

TABLE 2

| No. | Reducing Agent (in layer) | Hydrazine Compound (in developing solution) | Amount Added (g) | Relative Sensitivity | Note |
| --- | --- | --- | --- | --- | --- |
| 21 | Compound 4 | Compound 1 | 0.39 | 90 | Present Invention |
| 22 | Compound 4 | Compound 25 | 0.41 | 95 | " |
| 23 | Compound 6 | Compound 1 | 0.39 | 100 | " |
| 24 | Compound 6 | Compound 25 | 0.41 | 105 | " |
| 25 | Compound 7 | Compound 1 | 0.39 | 110 | " |
| 26 | Compound 7 | Compound 25 | 0.41 | 120 | " |
| 27 | Compound 9 | Compound 1 | 0.39 | 120 | " |
| 28 | Compound 9 | Compound 25 | 0.41 | 125 | " |
| 29 | Compound 4 | — | — | 40 | Comparison |
| 30 | Compound 6 | — | — | 50 | " |
| 31 | Compound 7 | — | — | 50 | " |
| 32 | Compound 9 | — | — | 60 | " |

It is apparent from the results as shown in Table 2 above that Samples No. 21 to No. 28 which contain both the phenol compound and the hydrazine compound according to the present invention exhibit high sensitivity in comparison with Samples No. 29 to No. 32 which do not contain the hydrazine compound.

EXAMPLE 3

Coating samples were produced in the same manner as in Example 1, except that 2.5 g of sodium acrylate, 2.5 g of gelatin, and 0.2 g of silver per 1 m² were contained therein. These samples were exposed to light in the same manner as in Example 1 and dipped in the following developing solution at 40° C. for 2 minutes.

| | |
| --- | --- |
| Sodium sulfite | 7 g |
| Anhydrous sodium carbonate | 5 g |
| Reducing agent (described in Table 3) | |
| Hydrazine compound (described in Table 3) | |
| pH was adjusted to 10.2 using sodium hydroxide and water was added to make 1 liter. | |

They were processed in the same manner as in Example 1 and the sensitivity thereof was measured. Relative sensitivities based on the sensitivity of Sample No. 36 being 100 are set forth in Table 3 below.

TABLE 3

| No. | Reducing Agent | Amount Added (g) | Hydrazine Compound | Amount Added (g) | Relative Sensitivity | Note |
| --- | --- | --- | --- | --- | --- | --- |
| 33 | Compound 1 | 12.4 | Compound 1 | 0.39 | 95 | Present Invention |
| 34 | Compound 1 | 12.4 | Compound 5 | 0.33 | 90 | " |

TABLE 3-continued

| No. | Reducing Agent | Amount Added (g) | Hydrazine Compound | Amount Added (g) | Relative Sensitivity | Note |
|---|---|---|---|---|---|---|
| 35 | Compound 2 | 13.8 | Compound 1 | 0.39 | 110 | " |
| 36 | Compound 2 | 13.8 | Compound 5 | 0.33 | 100 | " |
| 37 | Compound 1 | 12.4 | — | — | 40 | Comparison |
| 38 | Compound 2 | 12.4 | — | — | 50 | " |
| 39 | — | — | Compound 1 | 13.0 | 5 | " |
| 40 | — | — | Compound 5 | 11.0 | 10 | " |

It is apparent from the results as shown in Table 3 above that Samples No. 33 to No. 36 which contain both the phenol compound and the hydrazine compound according to the present invention exhibit high sensitivity in comparison with Samples No. 37 and No. 38 containing only the phenol compound and Samples No. 39 and No. 40 containing only the hydrazine compound.

While the invention has been described in detail and with reference to specific embodiments thereof, it will be apparent to one skilled in the art that various changes and modifications can be made therein without departing from the spirit and scope thereof.

What is claimed is:

1. A process for forming a polymeric image in a silver halide sensor type polymerizable light-sensitive material comprising a support having thereon a silver halide photographic emulsion layer, comprising reducing a development nucleus-containing silver halide using at least one phenol compound and at least one hydrazine compound in the presence of at least one non-gaseous ethylenically unsaturated compound capable of undergoing addition polymerization to selectively polymerize the ethylenically unsaturated compound in an area where the development nucleus-containing silver halide is present, the phenol compound being represented by the following general formula (I):

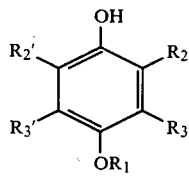

wherein $R_1$ represents an alkyl group or a substituted alkyl group; $R_2$ and $R_2'$, which may be the same or different, each represents hydrogen, an alkyl group, a substituted alkyl group, an aryl group, a substituted aryl group, an aralkyl group or a halogen atom; and $R_3$ and $R_3'$, which may be the same or different, each represents hydrogen, an alkyl group, a substituted alkyl group, an aryl group, a substituted aryl group, an aralkyl group, an alkoxy group, a thioalkyl group or a halogen atom, and the hydrazine compound being represented by the following general formula (II):

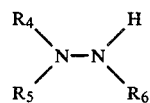

wherein $R_4$ represents hydrogen, a sulfo group (which may be a water-soluble metal salt or ammonium salt), an alkyl group, a substituted alkyl group, an aryl group, a substituted aryl group, an aralkyl group, a substituted aralkyl group, an acyl group, a substituted acyl group, an arylhydrazinocarbonyl group, a thiocarbamoyl group, an arylazothiocarbonyl group, an arylsulfonyl group or a substituted arylsulfonyl group; $R_5$ represents hydrogen, an alkyl group, a substituted alkyl group or an aryl group; $R_4$ and $R_5$ may be bonded to each other to form a ring comprising a member selected from a carbon atom, an oxygen atom and a nitrogen atom; $R_6$ represents hydrogen, a sulfo group (which may be a water-soluble metal salt or ammonium salt), an aryl group, an acyl group or a substituted acyl group; and $R_4$ and $R_6$ may be bonded to each other to form a ring, or a salt thereof.

2. A process for forming a polymeric image as claimed in claim 1, wherein $R_2$ and $R_2'$ in the general formula (I) each represents hydrogen, an alkyl group, a substituted alkyl group, an aryl group, a substituted aryl group or an aralkyl group and $R_3$ and $R_3'$ in the general formula (I) each represents hydrogen, an alkyl group, a substituted alkyl group, an aryl group, a substituted aryl group, an aralkyl group, an alkoxy group or a thioalkyl group.

3. A process for forming a polymeric image as claimed in claim 1, wherein the non-gaseous ethylenically unsaturated compound is selected from the group consisting of acrylamide, acrylonitrile, N-hydroxymethylacrylamide, methacrylamide, N-t-butylacrylamide, methacrylic acid, acrylic acid, calcium acrylate, aluminum acrylate, sodium acrylate, methacrylamide, methyl methacrylate, methyl acrylate, ethyl acrylate, 2-acrylamido-2-methylpropanesulfonic acid, vinylpyrrolidone, 2-vinylpyridine, 4-vinylpyridine, 2-methyl-N-vinylimidazole, potassium vinylbenzenesulfonate and vinylcarbazole.

4. A process for forming a polymeric image as claimed in claim 1, wherein the non-gaseous ethylenically unsaturated compound is a compound having two or more functional groups.

5. A process for forming a polymeric image as claimed in claim 1, wherein the non-gaseous ethylenically unsaturated compound is selected from the group consisting of N,N'-methylenebisacrylamide; ethylene glycol dimethylacrylate; diethylene glycol dimethacrylate; triethylene glycol dimethacrylate; polyethylene glycol dimethacrylate; divinyl ether; divinylbenzene bisphenol A dimethacrylate; trimethylolpropane triacrylate; pentaerythritol tetraacrylate; bisoxyethylated bisphenol A diacrylate; urethane group-containing unsaturated monomers, for example, reaction products of diol monoacrylate (or methacrylate) and diisocyanate, such as di(2'-methacryloxyethyl)-2,4-tolylenediurethane and di(2'-acryloxyethyl)trimethylenediurethane.

6. A process for forming a polymeric image as claimed in claim 1, wherein the process is carried out at a pH of 8 or more.

7. A process for forming a polymeric image as claimed in claim 1, wherein the non-gaseous ethylenically unsaturated compound is incorporated in the photographic light-sensitive material in an amount of from 1/30 to 30 times the weight of a hydrophilic or hydrophobic polymeric binder conventionally used during film formation.

8. A process for forming a polymeric image as claimed in claim 1, wherein the silver halide is incorporated in the photographic light-sensitive material in an amount of from 1/1,000 to 2 times the weight of a hydrophilic or hydrophobic polymeric binder conventionally used during film formation.

9. A process for forming a polymeric image as claimed in claim 1, wherein the non-gaseous ethylenically unsaturated compound, the phenol compound and the hydrazine compound are incorporated in the same layer of the photographic light-sensitive material.

10. A process for forming a polymeric image as claimed in claim 9, wherein the phenol compound is present in an amount of 3 parts by weight or more per 100 parts by weight of the non-gaseous ethylenically unsaturated used.

11. A process for forming a polymeric image as claimed in claim 10, wherein an amount of the hydrazine compound is in a range from 1/10,000 mols to 2 mols per mol of the phenol compounds.

12. A process for forming a polymeric image as claimed in claim 1, wherein the phenol compound and the hydrazine compound, and the non-gaseous ethylenically unsaturated compound are incorporated in different layers of the photographic light-sensitive material.

13. A process for forming a polymeric image as claimed in claim 12, wherein an amount of the phenol compound is in a range from 1/10 mols to 20 mols per mol of the silver halide.

14. A process for forming a polymeric image as claimed in claim 13, wherein an amount of the hydrazine compound is in a range from 1/10,000 mols to 2 mols per mol of the phenol compound.

15. A process for forming a polymeric image as claimed in claim 1, wherein the non-gaseous ethylenically unsaturated compound is present in a processing solution.

16. A process for forming a polymeric image as claimed in claim 1, wherein the phenol compound and the hydrazine compound are present in a processing solution.

17. A process for forming a polymeric image as claimed in claim 16, wherein the phenol compound is present in the processing solution in a range from 1/1,000 mols to 5 mols per liter of solution.

18. A process for forming a polymeric image as claimed in claim 17, wherein the hydrazine compound is present in the processing solution in a range from 1/10,000 mols to 2 mols per mol of the phenol compound.

19. A process for forming a polymeric image as claimed in claim 1, wherein one of the phenol compound and the hydrazine compound is present in the photographic light-sensitive material and the rest is present in a processing solution.

20. A process for forming a polymeric image as claimed in claim 1, wherein the process is carried out in the presence of a sulfite ion.

21. A process for forming a polymeric image as claimed in claim 1, wherein an amount of the sulfite ion present in a processing solution is 0.002 mols or more per liter of solution.

22. A process for forming a polymeric image as claimed in claim 1, wherein the non-gaseous ethylenically unsaturated compound is a monomer having a group capable of carrying an electric charge by ionization or addition of a hydrogen cation.

23. A process for forming a polymeric image as claimed in claim 22, wherein the monomer is a non-gaseous ethylenically unsaturated compound having a carboxy group, a metal salt thereof, an ammonium salt thereof, a sulfonic acid group, a metal salt thereof or an ammonium salt thereof.

24. A process for forming a polymeric image as claimed in claim 22, wherein the monomer is a non-gaseous ethylenically unsaturated compound having a basic nitrogen atom or a quaternary salt thereof.

25. A process for forming a polymeric image as claimed in claim 1, wherein an imagewise exposed photographic light-sensitive material comprising a support having thereon a silver halide emulsion layer is processed in a solution containing the non-gaseous ethylenically unsaturated compound, the phenol compound and the hydrazine compound.

26. A process for forming a polymeric image as claimed in claim 1, wherein an image exposed photographic light-sensitive material comprising a support having thereon a silver halide emulsion layer containing the phenol compound is processed in a solution containing the non-gaseous ethylenically unsaturated compound and the hydrazine compound.

27. A process for forming a polymeric image as claimed in claim 1, wherein an image exposed photographic light-sensitive material comprising a support having thereon a silver halide emulsion layer containing the non-gaseous ethylenically unsaturated compound is processed in a solution containing the phenol compound and the hydrazine compound.

* * * * *